(12) United States Patent
Kobozeva et al.

(10) Patent No.: US 7,069,535 B2
(45) Date of Patent: Jun. 27, 2006

(54) OPTICAL PROXIMITY CORRECTION METHOD USING WEIGHTED PRIORITIES

(75) Inventors: Olga A. Kobozeva, Los Altos, CA (US); Mario Garza, San Jose, CA (US); Ramnath Venkatraman, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 387 days.

(21) Appl. No.: 10/453,182

(22) Filed: Jun. 3, 2003

(65) Prior Publication Data

US 2004/0250232 A1    Dec. 9, 2004

(51) Int. Cl.
*G06F 17/50* (2006.01)
(52) U.S. Cl. .............. 716/21; 716/2; 716/4; 716/19
(58) Field of Classification Search ......... 716/1–21; 430/4, 5, 30
See application file for complete search history.

(56) References Cited

U.S. PATENT DOCUMENTS

| 5,740,068 | A  | * | 4/1998  | Liebmann et al. | 716/21 |
| 6,077,310 | A  | * | 6/2000  | Yamamoto et al. | 716/19 |
| 6,467,076 | B1 | * | 10/2002 | Cobb            | 716/19 |
| 2002/0138810 | A1 | * | 9/2002  | Lavin et al.    | 716/1  |
| 2003/0061592 | A1 | * | 3/2003  | Agrawal et al.  | 716/19 |
| 2004/0107412 | A1 | * | 6/2004  | Pack et al.     | 716/19 |
| 2004/0123265 | A1 | * | 6/2004  | Andreev et al.  | 716/21 |

* cited by examiner

*Primary Examiner*—Leigh M. Garbowski
(74) *Attorney, Agent, or Firm*—Yee & Associates (57) ABSTRACT

A method of silicon design reproducibility enhancement using priority assignments prior to performing a conventional optical proximity correction process on a device. The present invention seeks to improve the manufacturability of VLSI devices. The present invention inserts a priority assignment step prior to the conventional OPC correction process in order to assert better control over transistor parameters. The priority assignment step sorts the layout by degree of importance to the cell/device performance. Areas designated as critical are given higher priority values while areas designated as non-critical are given lower priority values. The present invention imposes more precise accuracy requirements to high priority value areas and less precise accuracy requirements to low priority value areas. As a result, the present invention imposes the tightest accuracy requirements to critical areas of device performance, rather than attempting to achieve overall accuracy during the OPC correction process.

27 Claims, 7 Drawing Sheets

Proposed CPC Flow

FIG._5A *(PRIOR ART)*
Conventional CPC Flow

Proposed CPC Flow
FIG._5B

OPTICAL PROXIMITY CORRECTION METHOD USING WEIGHTED PRIORITIES

BACKGROUND OF THE INVENTION

1. Technical Field

The field of the present invention pertains to electronic circuitry. More particularly, the present invention relates to a method for achieving tight control of transistor characteristics during the production process.

2. Description of Related Art

Photomasks are an integral component in the lithographic process. Photomasks are used as masters to optically transfer images of integrated circuits onto semiconductor wafers. A lightsource is used to project light through the photomask to cast an image of the device's design onto a silicon wafer coated with a light sensitive material. However, manufacturability of designs has become a critical issue as feature sizes have reached and surpassed resolution limits of lithography tools used in wafer production. Semiconductors are being built at the subwavelength level, which can result in problems because the circuit images printed on the silicon wafer are actually smaller than the wavelength of the lightsource used to expose the pattern. Such problems include projection distortion effects and effects neighboring features can have on the final position, shape, and size of a given feature of the projected design.

In order to be able to adequately reproduce designs on silicon wafers, new methods of reticle enhancement have been introduced, such as full chip optical proximity correction (OPC) and other resolution enhancement techniques (RET). While other RET techniques in most cases remain optional, OPC has become an integral part of the photomask tapeout flow at 0.13 µm technologies and below. The object of OPC is to make systematic modifications to the mask geometry that compensate for distortions introduced by the optical system and the photoresist and etching process. OPC uses the original mask design as an input and introduces some intentional distortions to the feature shapes on the mask in order to compensate for known process distortions during mask and wafer manufacturing. Such compensation, while not perfect, results in improvement of pattern fidelity and linewidth control that could not be achieved otherwise. OPC modifies the photomask by adding structures to the designs and patterns on masks to correct for critical dimension and resolution variations. These modifications enhance the printability of the pattern on the wafer.

Figure 2A:
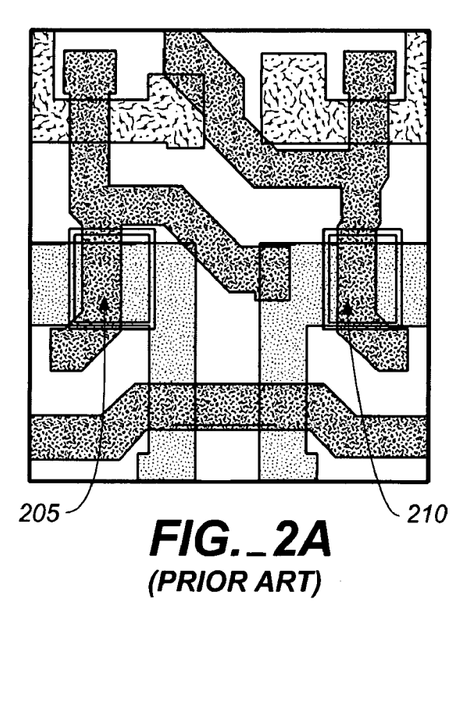
FIGS. 2A–2C show plan views of layout transformations at different steps in the process in accordance with the prior art.
Figure 2B:
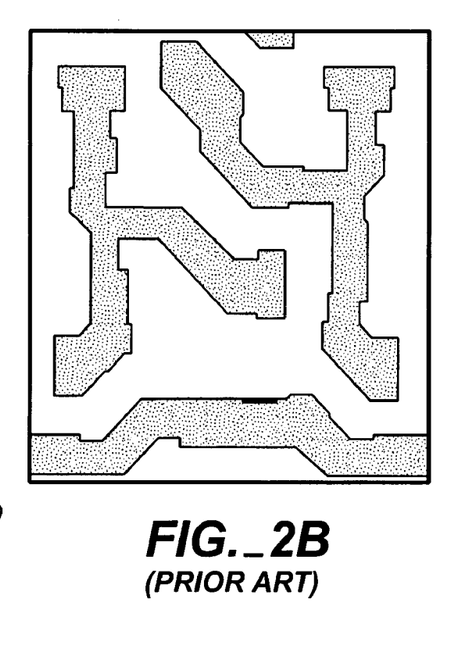
Figure 2C:
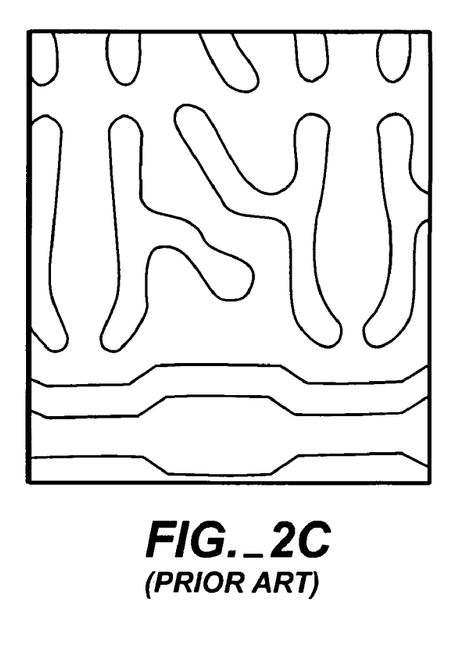

Conventional OPC techniques, however, contain several disadvantages. Although OPC significantly improves pattern printability, it has limited accuracy. FIGS. 2A, 2B, and 2C show an example of cell layout transformations that can occur through different steps of the wafer production process. The cell is first shown in its initial design in FIG. 2A with critical areas 205 and 210. The resulting photomask after performance of the OPC process is shown in FIG. 2B, whereby structures are modified in the initial design to correct for dimension and resolution variations. FIG. 2C shows the device after manufacturing and reveals how optical distortions and other process defects can result in distorting rectangles into ovals and line-width variations, even though OPC has been performed. These residual pattern errors have negative impact on device yield and manufacturability.

Figure 1:
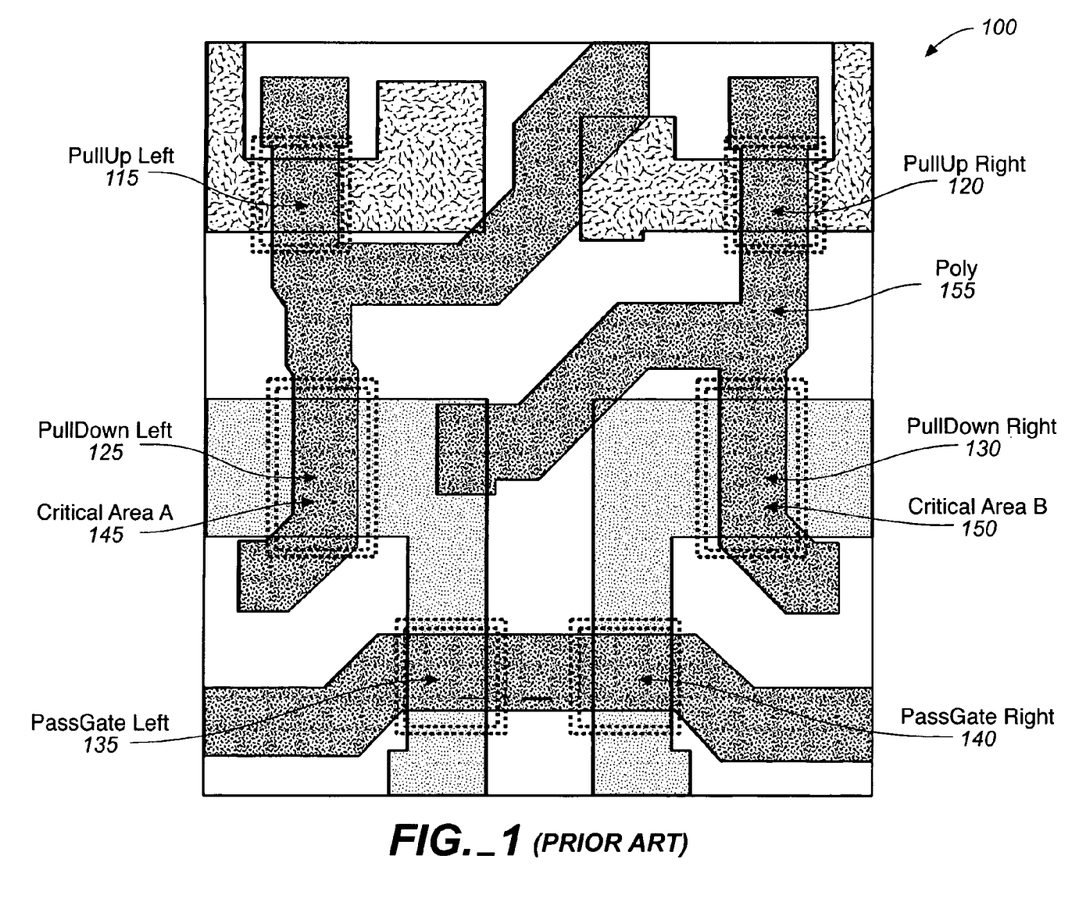
FIG. 1 shows a plan view of a 6 Transistor SRAM cell (1.87 sq.μm SRAM) layout and transistor assignment in accordance with the prior art.

Residual pattern errors are especially damaging for memories where OPC is expected to enable tight linewidth control in high-density environments. Of particular importance is the variance in parameters between transistors of the same functionality group. FIG. 1 illustrates a plan view of a high-density SRAM Cell. The particular cell layout and transistor assignment shown, for example purposes, is an LSI High Density 6 Transistor (6T) SRAM (Static Random Access Memory) for system-on-chip in 130 nm technology, otherwise known as a 1.87 sq. µm SRAM cell. Cell 100 contains six transistors and three functionality groups. Transistors 115 and 120 perform a pullup function, transistors 125 and 130 perform a pulldown function, and transistors 135 and 140 are passgate transistors. It is crucial, for the SRAM cell performance and functionality, to have an excellent match between transistor parameters within the same functionality group. In FIG. 1, critical area A 145 and critical area B 150 are within the same functionality group and require symmetry between the transistors.

Figure 3A:
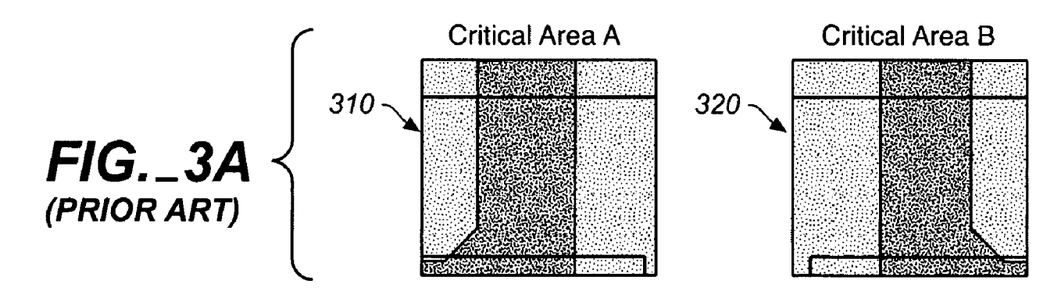
FIGS. 3A–3C show plan views of pulldown device asymmetry induced by conventional OPC techniques in accordance with the prior art.
Figure 3B:
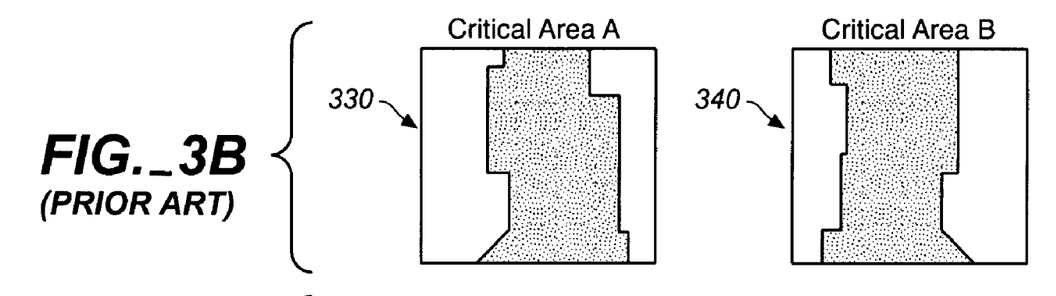
Figure 3C:
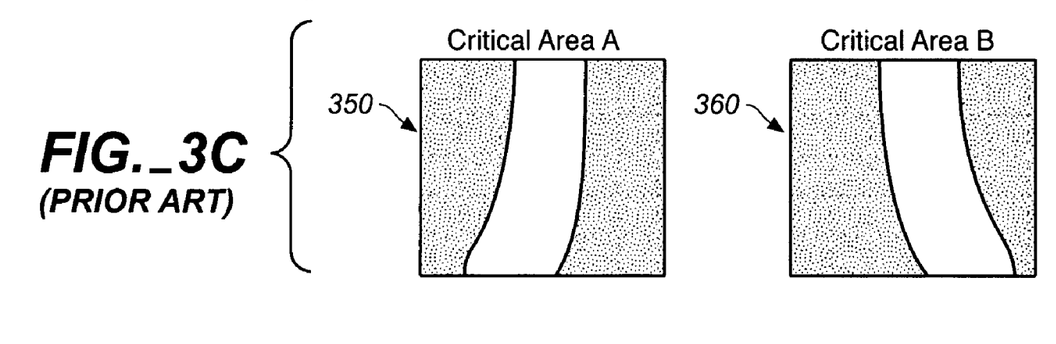

Asymmetry between grouped transistors leads to yield loss and increased marginality of operation at low voltages. For example, automated OPC processes as implemented in the 130 nm logic technology led to symmetry issues within 1.87 sq.µm SRAM cell. Using the 1.87 sq.µm SRAM cell for illustration purposes, close up plan views of critical areas of the wafer pattern as shown in FIGS. 3A, 3B, and 3C demonstrate how the OPC process may induce asymmetry into the memory cell. FIG. 3A depicts the initial design of the cell, where left transistor in critical area A 310 and right transistor in critical area B 320 of the cell are drawn with the same dimensions. In the layout after OPC has been performed, FIG. 3B shows there is a clear difference in the line-width patterns of left transistor 330 and right transistor 340. Left transistor 350 and right transistor 360 of the resulting manufactured wafer as shown in FIG. 3C consequently contain differences in the line-width patterns between the transistors.

Figure 4A:
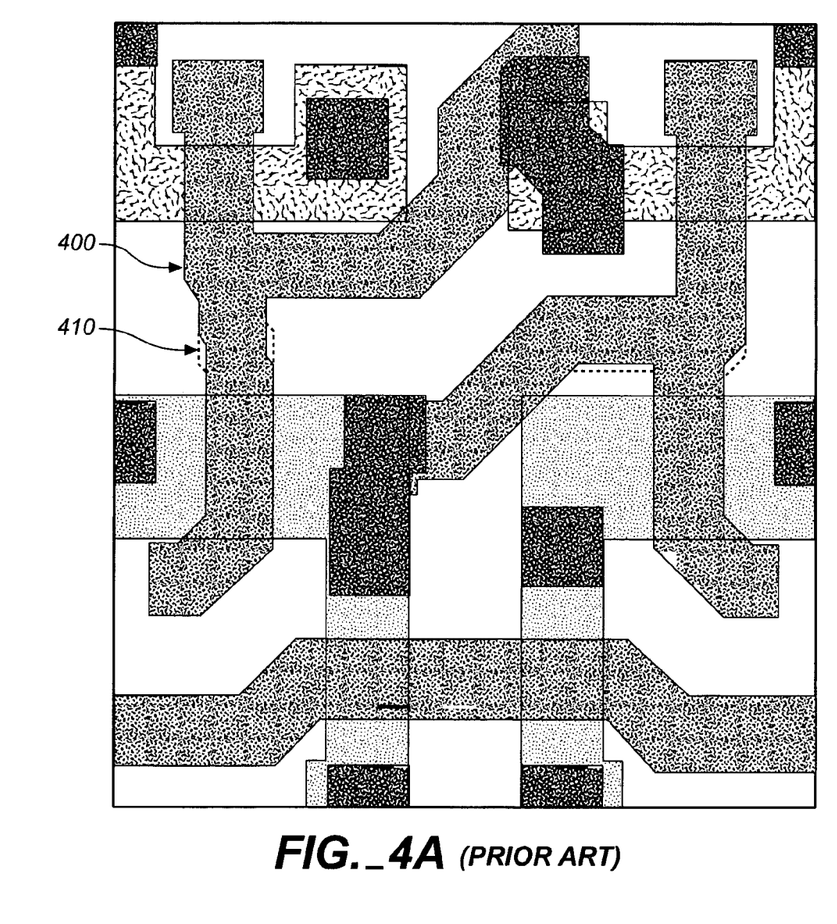
FIGS. 4A–C show plan views of an example of slight layout modifications leading to degradation of device symmetry in accordance with the prior art.
Figure 4B:
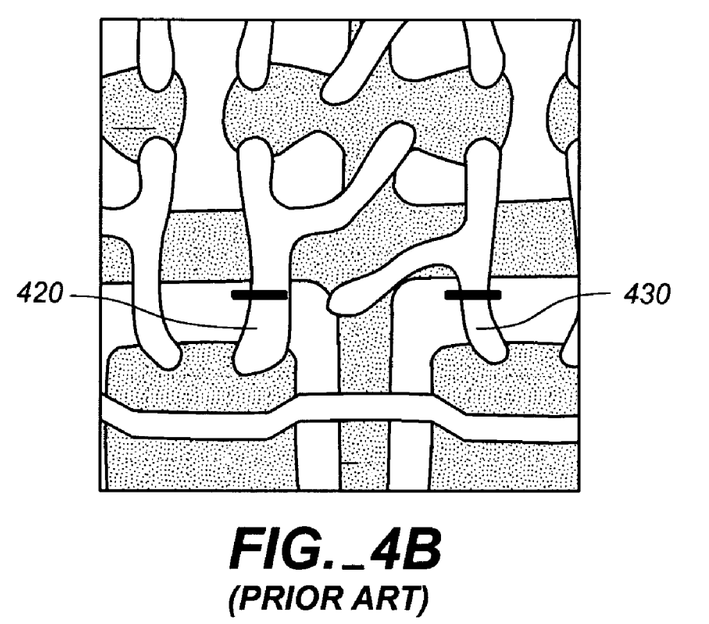
Figure 4C:
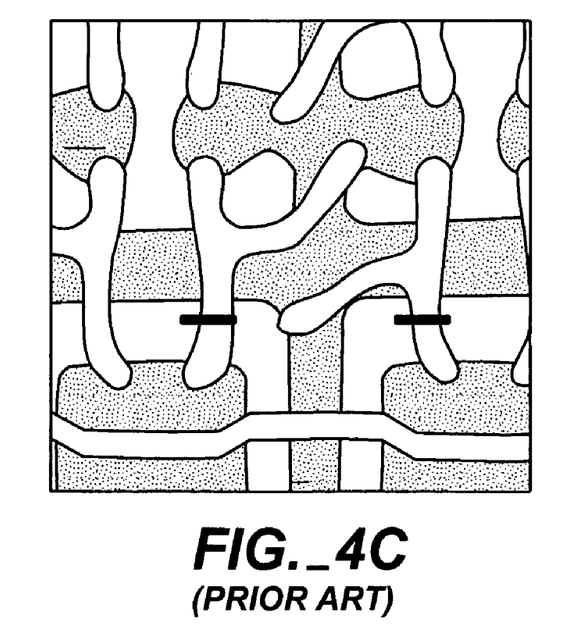

Different environments can also affect the final position, shape, and size of the resulting transistor features. For example, OPC-induced asymmetry within the 6 Transistor SRAM cell has occurred due to a slight redesign of poly layout in an area away from transistors in order to ease the task of ILD (interlayer dielectric) fill. The redesign unexpectedly led to cell asymmetry due to reduction of linewidth, a lower transistor threshold voltage, and higher drive current of the left pulldown transistor. FIGS. 4A–C provide an example, using a 6 transistor SRAM cell (1.87 sq.µm SRAM) for illustration purposes, of how slight modifications of the cell layout can lead to degradation of functionality group symmetry.

FIG. 4A shows two cell layouts, solid line layout 400 and dotted line layout 410, one imposed over the other. Design modifications were made only to solid line layout 400. FIG. 4C illustrates the desired result of the OPC process—symmetric transistors in the same functionality group. In contrast, FIG. 4B illustrates the negative effect small design changes to non-critical poly features in solid line layout 400 in FIG. 4A have on other neighboring features in the cell. The design changes cause asymmetry between the transistors in the functionality group, such that after the OPC process has been performed, the length of left pulldown transistor 420 is different from right pulldown transistor 430. As a result, there is a difference in the transistors' drive current. Conventional OPC processes contain weaknesses since fidelity of transistors may be sacrificed, due to very small changes in surrounding areas, to satisfy the fidelity of other non-critical poly features.

Existing methods to deal with correcting optical distortions in the manufacturing process include performing multiple iterations of fine OPC tuning and multiple (up to 8–10) re-tapeouts of the poly mask, and applying manual OPC to SRAM cells and automated OPC to the rest of the chip. However, the existing methods described above contain several disadvantages. Performing multiple iterations of fine OPC tuning and multiple re-tapeouts of the poly mask is expensive and has a long cycle time to complete each iteration of improvement. Applying manual OPC to SRAM cells and automated OPC to the rest of the chip is not acceptable for system on the chip products using embedded memories, because manual OPC could cause a mismatch between linewidth within logic and memory areas.

Therefore, a need exists for improving the manufacturability of subwavelength optical lithography systems. Specifically, a need exists for enhancing the effectiveness of the OPC process in order to assert better control over transistor parameters.

SUMMARY OF THE INVENTION

The present invention seeks to improve the manufacturability of SRAM devices, especially in process technologies with designed dimensions smaller than the wavelength of optical lithography systems used to produce wafers. The present invention applies primarily to process technologies of 130 nm and below. The present invention inserts a priority assignment step prior to performing a conventional OPC correction process to facilitate better control over transistor parameters. The priority assignment step sorts the layout by degree of importance to the cell/device performance. Areas designated as critical are given higher priority values while areas designated as non-critical are given lower priority values. The present invention imposes more precise accuracy requirements to high priority value areas and less precise accuracy requirements to low priority value areas. As a result, the present invention imposes the tightest accuracy requirements to high priority areas, rather than attempting to achieve overall accuracy when performing a conventional OPC correction process.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 5A:
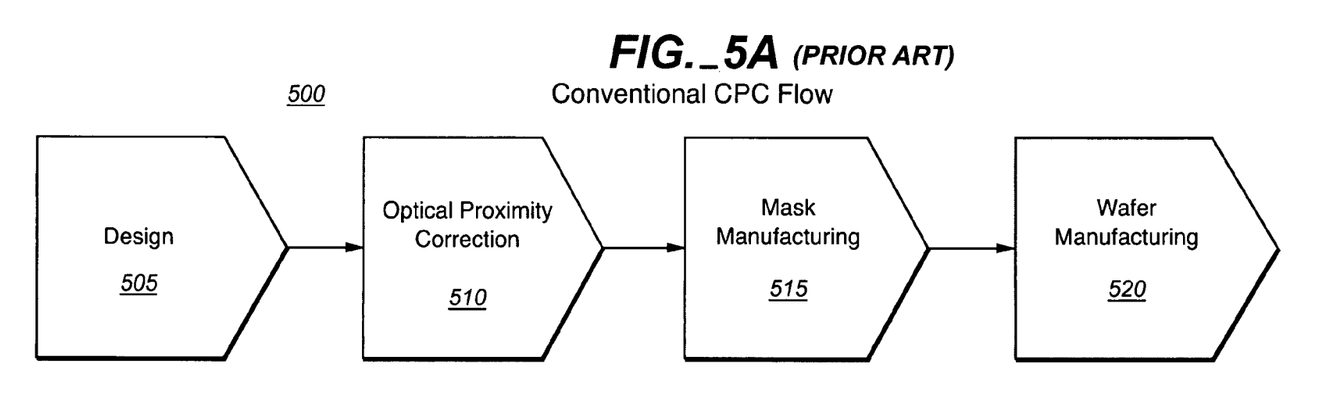
FIG. 5A shows a schematic flow chart of the layout transformation flow from computer design to manufactured wafer in accordance with the prior art.

Referring now to the drawings, wherein corresponding reference numerals are used to represent corresponding elements of all figures unless otherwise indicated, FIG. 5A illustrates a conventional OPC flow from computer design to manufactured wafer. Conventional OPC flow 500 begins with design step 505. In order to compensate for anticipated distortions introduced by the optical system and the photoresist and etching processes, optical proximity correction 510 techniques are performed. Optical lithographers then adapt the corrected mask design for mask manufacturing 515. Corrections are made by adding structures to the designs and patterns on the mask to correct for critical dimension and resolution variations. Such corrections enhance the printability of the pattern on the wafer. Wafers manufacturing 520 can then take place after the proximity effects have been addressed.

Figure 5B:
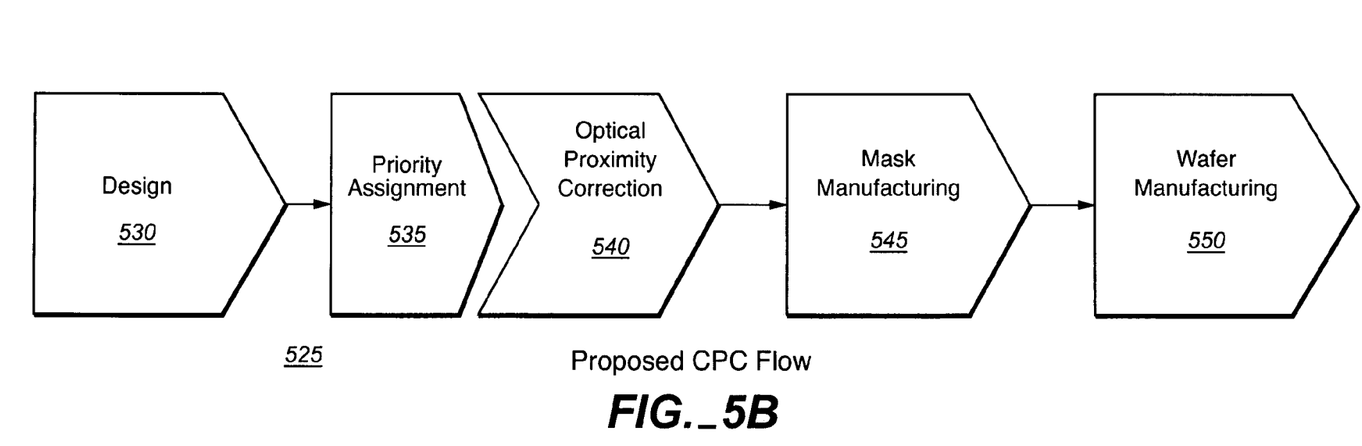
FIG. 5B shows a schematic flow chart of the layout transformation flow from computer design to manufactured wafer in accordance with the present invention.

FIG. 5B is a schematic flow chart illustrating a process from computer design to manufactured wafer in accordance with a preferred embodiment of the present invention. Proposed OPC flow 525 of the present invention improves upon conventional OPC processes by assigning priorities to critical areas of the wafer pattern prior to performing the conventional OPC correction process. Specifically, FIG. 5B shows priority assignment step 535 inserted between initial design 530 and conventional optical proximity correction process 540. Areas of the initial device design layout deemed critical to device performance are assigned higher priority values in priority assignment step 535. Areas of the layout deemed non-critical are given lower priority values. More precise accuracy requirements are imposed on the high priority value areas than on the low priority value areas. As a result, cell symmetry will be improved over using conventional OPC process 540 alone. Thus, a priority-weighted OPC approach is created by enhancing conventional OPC process 540 by including a preceding priority assignment step 535.

A preferred embodiment of the present invention seeks to improve the manufacturability of VLSI and SRAM devices in particular. The priority-weighted OPC approach sorts the components of poly gate layout by degree of importance to the cell/device performance. For example, one such assignment may consist of assigning poly over active areas as "high priority" while assigning poly over field areas as "regular priority." Another example of an assignment structure could assign poly over N (N diffusion layer) active as "Priority 1," poly over P (P diffusion layer) active as "Priority 2," and poly over field as "Priority 3." A further example of a possible assignment structure includes assigning pulldown device as "Priority 1," passgate device as "Priority 2," pullup device as "Priority 3," poly endcaps as "Priority 4," and poly over field as "Priority 5." In each of the above priority-weighted assignments, accuracy requirements during the OPC process are focused on designated high priority or critical areas rather than those areas designated as a lower priority.

Figure 6A:
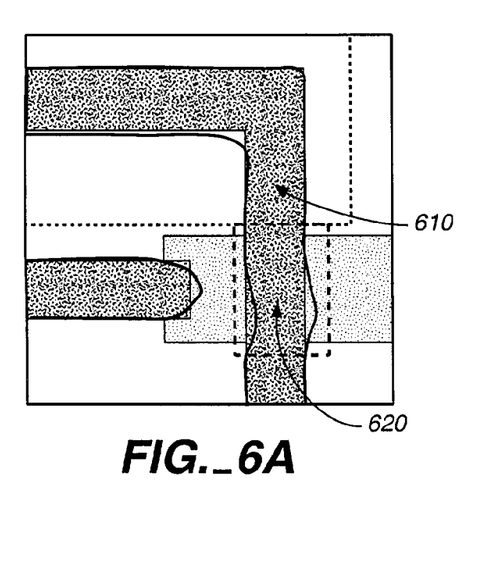
FIGS. 6A–6C shows plan views of acceptable and non-acceptable wafer pattern errors.
Figure 6B:
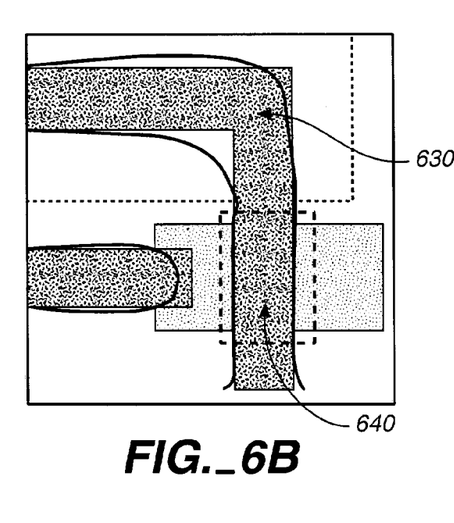
Figure 6C:
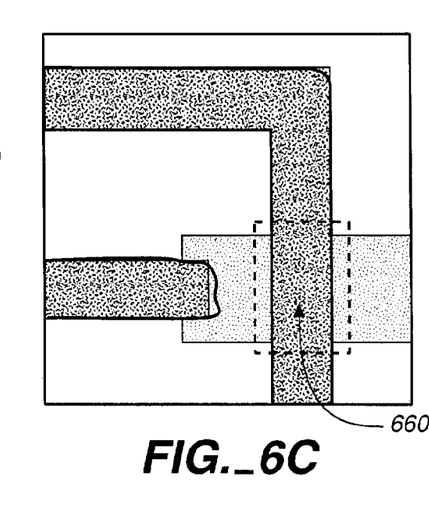

With reference now to FIGS. 6A, 6B, and 6C, plan views illustrating acceptable and non-acceptable wafer pattern errors in accordance with the present invention are shown.

Specifically, FIG. 6A depicts unacceptable wafer pattern errors as a result of the OPC process. Low priority poly area 610 shows some degree of line-width variation errors. However, high priority poly area 620, which is a critical area, shows significant distortion of the initial design. Such distortion is unacceptable for the critical areas due the resulting negative impact on device yield and manufacturability. In contrast, FIGS. 6B and 6C illustrate acceptable wafer pattern errors produced after the OPC process. Although FIG. 6B shows significant distortion of the low priority poly area 630, this distortion is acceptable because the high priority poly area 640 or critical area is shown to have minimal distortion errors. Likewise, the wafer pattern errors in FIG. 6C are also acceptable, since the high priority poly area 660 contains acceptable pattern errors.

The present invention proposes that priority assignment step can be accomplished by generating layers that carry priority information. These layers may include, for example, a transistor layer, or pulldown layer and pullup layer, etc. For instance, each group or layer is assigned a weight value depending on how critical the layer is to cell/device performance. The OPC correction process takes weight value into account while making layout modifications. Rather than performing the OPC process to achieve overall accuracy, the present invention segregates the cell into areas of critical importance, whereby more precise accuracy requirements are imposed on these critical or high priority areas. Such requirements should be imposed in a form specific to the OPC tool used. As such, overall accuracy requirements do not have to increase, and therefore OPC runtime will not be wasted on features of low importance.

Thus, the present invention proposes a new two-step approach to performing the OPC process during wafer production. Whereas conventional methods of wafer production employ OPC techniques after design of the device, the present invention inserts a priority assignment step prior to performing conventional OPC processes on the device. The OPC process is performed with tight accuracy requirements being imposed on these high priority areas. The present invention provides an advantage in wafer production in that it provides a way to better control transistor parameters. Transistor parameters need to be as accurate as possible in critical areas, for residual pattern errors occurring from the OPC process have a negative impact on device yield and manufacturability. Furthermore, the present invention will offers less variability in device parameters due to possible changes/updates of the OPC program for future re-tapeouts.

An additional advantage of the present invention is that SRAM cell symmetry will be improved. As it is crucial for SRAM cell performance and functionality that an excellent match exists between transistor parameters within the same functionality group, the present invention decreases yield loss caused by asymmetry between transistors and provides for better functionality of SRAM memories at lower voltages.

While particular wafer production materials and wafer manufacturing methods have been disclosed, any suitable material or manufacturing method may be utilized without departing from the scope of the invention. The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of enhancing the effectiveness of optical proximity correction on a device, the method comprising:
    providing an initial device design layout having a plurality of areas;
    identifying areas within the plurality of areas of the initial device design layout that are critical to device performance;
    assigning priority values to each area within the plurality of areas prior to performing optical proximity correction on the device, wherein the areas identified as critical are given a higher priority value than areas designated as non-critical; and
    imposing more precise accuracy requirements to high priority value areas than low priority value areas.

2. The method of enhancing the effectiveness of optical proximity correction on a device in claim 1 wherein the initial design layout is for a VLSI device.

3. The method of enhancing the effectiveness of optical proximity correction on a device in claim 1 wherein the initial design layout is for an SRAM device.

4. The method of enhancing the effectiveness of optical proximity correction on a device in claim 1 wherein the critical areas include poly over active.

5. The method of enhancing the effectiveness of optical proximity correction on a device in claim 1 wherein the critical areas include poly over field.

6. The method of enhancing the effectiveness of optical proximity correction on a device in claim 1 wherein the critical areas include pulldown devices.

7. The method of enhancing the effectiveness of optical proximity correction on a device in claim 1 wherein the critical areas include passgate devices.

8. The method of enhancing the effectiveness of optical proximity correction on a device in claim 1 wherein the critical areas include pullup devices.

9. The method of enhancing the effectiveness of optical proximity correction on a device in claim 1 wherein the critical areas include poly endcaps.

10. A method of enhancing the effectiveness of optical proximity correction on a device, the method comprising:
    providing an initial device design layout having a plurality of areas;
    identifying areas within the plurality of areas of the initial device design layout that are critical to device performance;
    assigning priority values to each area within the plurality of areas prior to performing optical proximity correction on the device, wherein the areas identified as critical are given a higher priority value than areas designated as non-critical;
    generating layers of the initial device design layout which contain priority value information regarding critical areas of each layer; and
    imposing more precise accuracy requirements to high priority value areas than low priority value areas.

11. The method of enhancing the effectiveness of optical proximity correction on a device in claim 10 wherein the initial design layout is for a VLSI device.

12. The method of enhancing the effectiveness of optical proximity correction on a device in claim 10 wherein the initial design layout is for an SRAM device.

13. The method of enhancing the effectiveness of optical proximity correction on a device in claim 10 wherein the priority value information is weighted.

14. A method of improving symmetry between functional groups of a semiconductor device which undergo optical proximity correction, the method comprising:
providing an initial device design layout containing functionality groups having a plurality of areas;
identifying areas within the plurality of areas of a functional group in the initial device design layout that require symmetry, wherein the areas requiring symmetry are designated as critical areas;
assigning priority values to each area within the plurality of areas prior to performing optical proximity correction on the device, wherein the areas identified as critical are given a higher priority value than areas designated as non-critical; and
imposing more precise accuracy requirements to high priority value areas than low priority value areas.

15. The method of improving symmetry between functional groups of a semiconductor device which undergo optical proximity correction in claim 14 wherein the initial design layout is for a VLSI device.

16. The method of improving symmetry between functional groups of a semiconductor device which undergo optical proximity correction in claim 14 wherein the initial design layout is for an SRAM device.

17. The method of improving symmetry between functional groups of a semiconductor device which undergo optical proximity correction in claim 14 wherein the priority values are weighted.

18. A data processing system for enhancing the effectiveness of optical proximity correction, comprising:
means for providing an initial device design layout having a plurality of areas;
means for identifying areas within the plurality of areas of the initial device design layout that are critical to device performance;
means for assigning priority values to each area within the plurality of areas prior to performing optical proximity correction on the device, wherein the areas identified as critical are given a higher priority value than areas designated as non-critical; and
means for imposing more precise accuracy requirements to high priority value areas than low priority value areas.

19. The data processing system for enhancing the effectiveness of optical proximity correction in claim 18 wherein the initial design layout is for a VLSI device.

20. The data processing system for enhancing the effectiveness of optical proximity correction in claim 18 wherein the initial design layout is for an SRAM device.

21. The data processing system for enhancing the effectiveness of optical proximity correction in claim 18 wherein the critical areas include poly over active.

22. The data processing system for enhancing the effectiveness of optical proximity correction in claim 18 wherein the critical areas include poly over field.

23. The data processing system for enhancing the effectiveness of optical proximity correction in claim 18 wherein the critical areas include pulldown devices.

24. The data processing system for enhancing the effectiveness of optical proximity correction in claim 18 wherein the critical areas include passgate devices.

25. The data processing system for enhancing the effectiveness of optical proximity correction in claim 18 wherein the critical areas include pullup devices.

26. The data processing system for enhancing the effectiveness of optical proximity correction in claim 18 wherein the critical areas include poly endcaps.

27. A computer program product in a computer readable medium for enhancing the effectiveness of optical proximity correction, comprising:
first instructions for providing an initial device design layout having a plurality of areas;
second instructions for identifying areas within the plurality of areas of the initial device design layout that are critical to device performance;
third instructions for assigning priority values to each area within the plurality of areas prior to performing optical proximity correction on the device, wherein the areas identified as critical are given a higher priority value than areas designated as non-critical; and
fourth instructions for imposing more precise accuracy requirements to high priority value areas than low priority value areas.

* * * * *